United States Patent
Esler et al.

(10) Patent No.: US 11,551,993 B2
(45) Date of Patent: Jan. 10, 2023

(54) POWER OVERLAY MODULE AND METHOD OF ASSEMBLING

(71) Applicant: GE AVIATION SYSTEMS LLC, Grand Rapids, MI (US)

(72) Inventors: David Richard Esler, Gloversville, NY (US); Christopher James Kapusta, Delanson, NY (US); Arun V. Gowda, Rexford, NY (US); Weijun Yin, Niskayuna, NY (US); Liqiang Yang, Pompano Beach, FL (US); Richard Anthony Eddins, Margate, FL (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 17/005,536

(22) Filed: Aug. 28, 2020

(65) Prior Publication Data
US 2022/0070996 A1 Mar. 3, 2022

(51) Int. Cl.
| H05K 1/02 | (2006.01) |
| F28F 13/18 | (2006.01) |
| H01L 23/373 | (2006.01) |
| H05K 7/20 | (2006.01) |
(Continued)

(52) U.S. Cl.
CPC .......... *H01L 23/3735* (2013.01); *F28F 13/18* (2013.01); *H01L 23/3731* (2013.01); *H05K 1/0201* (2013.01); *H05K 7/205* (2013.01); *H05K 7/20509* (2013.01); *F28F 2013/001* (2013.01); *H01L 23/3672* (2013.01)

(58) Field of Classification Search
CPC ............ H05K 7/2039; H05K 7/20481; H05K 7/20509; H05K 7/209; H01L 23/36; H01L 23/3731; H01L 23/467; H01L 23/3672
See application file for complete search history.

(56) References Cited

U.S. PATENT DOCUMENTS

| 4,312,119 A | 1/1982 | Perucchi et al. |
| 5,810,987 A | 9/1998 | Opitz |
(Continued)

FOREIGN PATENT DOCUMENTS

EP 2228820 A2 9/2010

OTHER PUBLICATIONS

European Search Opinion for counterpart application EP 21192478, dated Feb. 2022.*

*Primary Examiner* — Zachary Pape
(74) *Attorney, Agent, or Firm* — McGarry Bair PC

(57) ABSTRACT

A power overlay (POL) module includes a semiconductor device having a first side and an opposing second side, a dielectric sheet having a first side coupled to the semiconductor device second side, and an opposing second side, the dielectric sheet defining an aperture therethrough. The POL module also includes a first conductive layer disposed on the second side of the dielectric sheet and electrically coupled through the aperture to the semiconductor device second surface, a first conductive plate having a first side, and an opposing second side coupled to the first surface of the semiconductor device. The POL module further includes a first heat sink coupled the first side of the conductive plate and a first thermal interface layer disposed between the first conductive plate and the first heat sink.

15 Claims, 3 Drawing Sheets

(51) Int. Cl.
*F28F 13/00* (2006.01)
*H01L 23/367* (2006.01)

(56) References Cited

U.S. PATENT DOCUMENTS

| | | | | |
|---|---|---|---|---|
| 6,165,612 | A * | 12/2000 | Misra | C08L 81/06 |
| | | | | 156/272.2 |
| 7,098,070 | B2 * | 8/2006 | Chen | H01L 21/76898 |
| | | | | 438/106 |
| 7,538,045 | B2 | 5/2009 | Bhatia et al. | |
| 8,801,908 | B2 | 8/2014 | Cheng et al. | |
| 8,987,876 | B2 * | 3/2015 | Gowda | H01L 23/49503 |
| | | | | 257/672 |
| 9,303,327 | B2 | 4/2016 | Yeong et al. | |
| 9,704,788 | B2 * | 7/2017 | Gowda | H01L 23/49541 |
| 9,828,689 | B2 | 11/2017 | Ookubo | |
| 10,186,477 | B2 * | 1/2019 | Gowda | H01L 24/24 |
| 10,269,688 | B2 * | 4/2019 | Gowda | H01L 23/49568 |
| 10,269,699 | B2 | 4/2019 | Ma et al. | |
| 2010/0255742 | A1 * | 10/2010 | Yun | B32B 27/12 |
| | | | | 442/117 |
| 2018/0148855 | A1 | 5/2018 | Nakagawa et al. | |
| 2019/0371705 | A1 | 12/2019 | Yamauchi et al. | |
| 2019/0372441 | A1 | 12/2019 | Yin et al. | |
| 2021/0249359 | A1 * | 8/2021 | Patil | H01L 23/3677 |

* cited by examiner

POWER OVERLAY MODULE AND METHOD OF ASSEMBLING

TECHNICAL FIELD

The disclosure relates generally to structures and methods for packaging power semiconductor devices and, more particularly, to a power overlay module structure that includes an improved thermal interface.

BACKGROUND

The growing demand for power electronic devices to manage high power densities has led to the development of the power electronic module or power module. The power module is an assembly typically including several power components, such as power semiconductor devices, internally interconnected to perform a power conversion function. Power modules are used in power conversion equipment such as industrial motor drives, uninterruptible power supplies, and inverters. Power modules provide the packaging or physical containment for a set of power semiconductor components. The power semiconductors (or "dies") are typically soldered or sintered onto a power electronic substrate that supports the power semiconductors, provides electrical and thermal contact and electrical insulation where needed.

More recently, power modules increasingly employ a power overlay (POL) module type packaging and interconnect system. Such POL modules use multiple layers of conductive and insulative materials to support the power semiconductor devices, provide electrical interconnections between the semiconductor devices and external circuits, and manage heat generated during normal operation.

BRIEF DESCRIPTION

In one aspect, the present disclosure relates to a POL module. The POL module includes a semiconductor device having a first side and an opposing second side, a dielectric sheet having a first side coupled to the semiconductor device second side, and an opposing second side, the dielectric sheet defining an aperture therethrough. The POL module also includes a conductive layer disposed on the second side of the dielectric sheet and electrically coupled through the aperture to the semiconductor device second surface, a first conductive plate having a first side, and an opposing second side coupled to the first surface of the semiconductor device. The POL module further includes a first heat sink coupled the first side of the conductive plate and a first thermal interface layer disposed between the first conductive plate and the first heat sink.

In another aspect, the present disclosure relates to a method of assembling a POL module. The method includes coupling a set of semiconductor devices to a dielectric sheet, forming a conductive layer on the dielectric sheet, and coupling a first conductive plate to the set of semiconductor devices. The method also includes applying an electrically insulative, thermally conductive first coating to at least one of the first conductive plate and a first heat sink, the coating defining a first thermal interface layer, and coupling the first heat sink to the first conductive plate with the first thermal interface layer disposed therebetween.

BRIEF DESCRIPTION OF THE DRAWINGS

A full and enabling disclosure of the present description, including the best mode thereof, directed to one of ordinary skill in the art, is set forth in the specification, which refers to the appended FIGS., in which.

DETAILED DESCRIPTION

Figure 1:
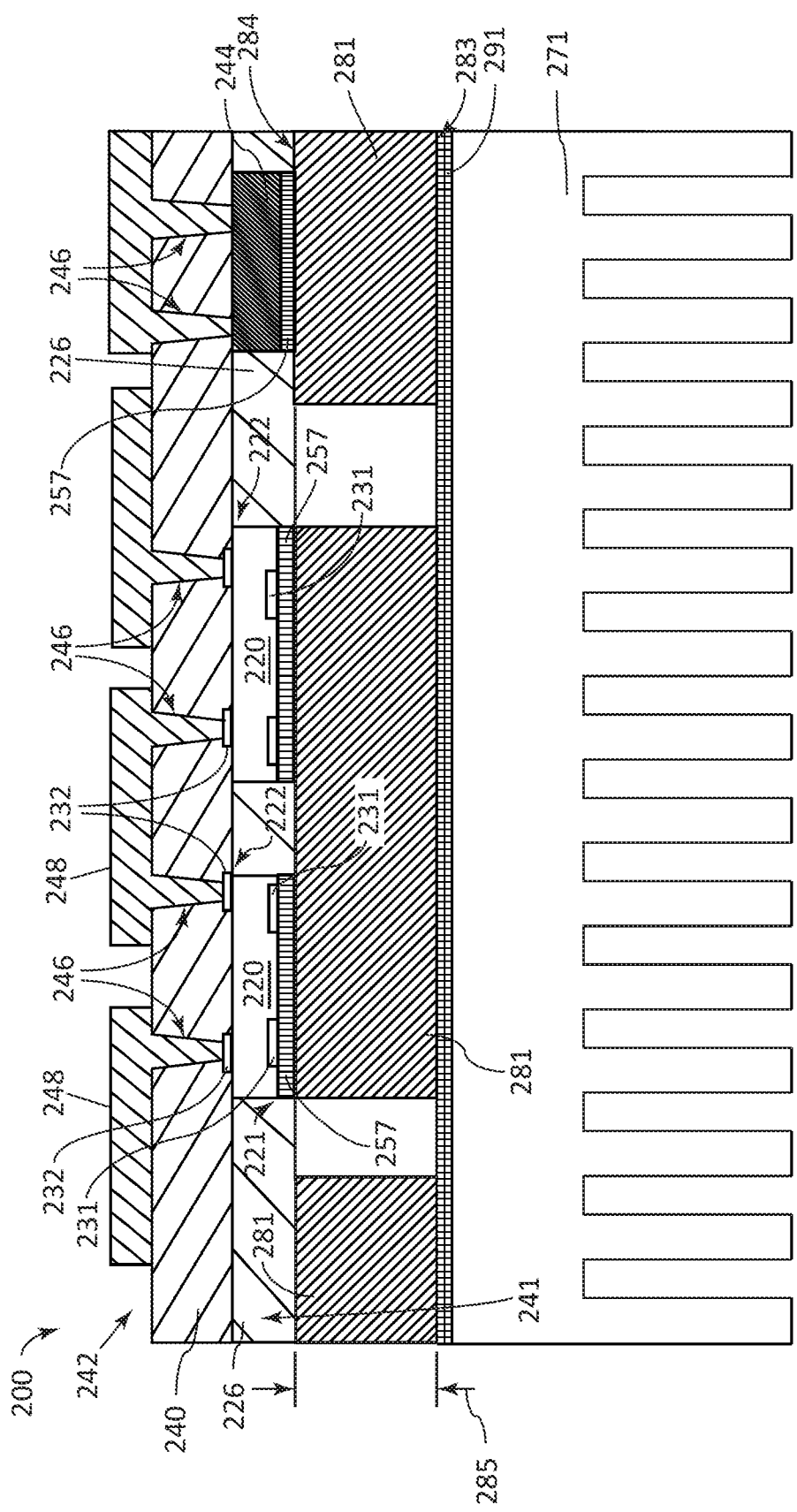
FIG. 1 illustrates a schematic cross-sectional view of a POL module, in accordance with various aspects described herein.

The described aspects of the present disclosure are directed to a POL module that includes an improved thermal interface. Aspects described herein are not limited to any specific electrical power architecture or application, and aspects can be utilized in any desired electrical power system or configuration.

While "a set of" various elements will be described, it will be understood that "a set" can include any number of the respective elements, including only one element. All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements.

Insulative coatings are used to insulate electrical conductors in electric machines, and generally exhibit a low electrical conductivity and a high thermal conductivity. As used herein, the term "insulative coating" refers to a coating that is both electrically insulative and thermally conductive. Insulative coatings generally exhibit a low electrical conductivity (for example, less than about $10^{-8}$ siemens per meter (S/m)) and a high thermal conductivity (for example, greater than about 1 watt per meter-Kelvin (W/mK).

As used herein, the term "semiconductor device" refers to a semiconductor component, device, die or chip that perform specific functions such as a power transistor, power diode, or analog amplifier, as non-limiting examples. Typical semiconductor devices include input/output (I/O) interconnections, referred to herein as contacts or contact pads, which are used to connect the semiconductor device to external circuitry and are electrically coupled to internal elements within the semiconductor device. The semiconductor devices described herein can be power semiconductor devices used as electrically controllable switches or rectifiers in power electronic circuits, such as switched mode power supplies, for example. Non-limiting examples of semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). Semiconductor devices can also be digital logic devices, such as a microprocessor, microcontroller, memory device, video processor, or an Application Specific Integrated Circuit (ASIC), as non-limiting examples.

It should be understood that for ease of description and understanding, the accompanying drawings are not necessarily drawn to scale, and may be depicted schematically. For example, certain elements in the drawings may be larger or smaller than illustrated, relative to other elements depicted in the drawings. While the various aspects of a POL module disclosed below are shown in the Figures and described as including a particular arrangement of a semiconductor device, interconnection wiring and electronic package terminals, it is understood that alternative arrangements and configurations could also be implemented and thus aspects are not limited only to the specifically illustrated devices and arrangements thereof. That is, aspects described herein should also be understood to encompass electronics packages that might include additional electronic components and can additionally or alternatively include one or more alternative device types of semiconductor devices including acoustic devices, microwave devices, millimeter devices, RF communication devices, and micromechanical (MEMS) devices. It is contemplated that aspects of the POL modules as disclosed herein can comprise a semiconductor module or power module providing physical support or containment for one or more semiconductor devices defining a topology. Aspects described herein can also include one or more resistors, capacitors, inductors, filters, switches and similar devices and combinations thereof. As used herein the terms "electrical component" and "electronic component" can be understood to encompass any of the various types of semiconductor devices described above as well as resistors, capacitors, inductors, filters and similar passive devices, and energy storage components.

Conventional semiconductor device modules, power modules and embedded devices use POL technology to provide numerous advantages in size, performance, and cost. The conventional POL module typically includes a set of semiconductor devices having conductive contacts on two opposing sides (e.g., a top side and a bottom side, respectively). The bottom side of the semiconductor devices are soldered to one side (e.g., a top side) of a-metal insulated substrate layer (for example, a direct bond copper (DBC) substrate). Conventional insulated metal substrates typically consist of three layers, i.e., a metal top and bottom layer with a ceramic insulating layer between. The metal layers are either directly bonded or brazed to the ceramic layer. The ceramic can be alumina, aluminum nitride, silicon nitride, or other ceramic types. The metal insulated substrate is typically soldered on an opposite side (e.g., a bottom side) to a baseplate. The baseplate is typically further mounted to a conventional heat sink. The baseplate is typically mechanically mounted to the heat sink using fasteners (e.g., threaded fasteners) in conjunction with a thermal interface material such as a thermal grease or pad disposed between the baseplate and heat sink. Additionally, a dielectric layer is mounted to the top side of the semiconductor devices. A metallization layer or conductive layer is deposited on top of the dielectric layer and through vias or apertures defined in the dielectric layer enabling connection of the metallization layer to the top side of the semiconductor devices therethrough through the dielectric layer.

Typically, the metal insulated substrate is a prefabricated component arranged as a metal-insulator-metal substrate, with an insulator layer disposed between a first metal layer (e.g., a first copper sheet) and an opposing second metal layer (e.g., a second copper sheet). The conventional metal insulated substrate is commonly used in POL modules, due to their thermal conductivity and rigidity, to support the semiconductor devices while simultaneously providing an electrical interconnect structure. For example, a typical insulator layer of a metal insulated substrate comprises a non-organic ceramic (for example, aluminum nitride (AlN)) layer having a first insulator side (e.g., a bottom side) and an opposing second insulator side (e.g., a top side). The first metal layer (i.e., the first copper sheet) is bonded to the first insulator layer side, and the second metal layer (i.e., the second copper sheet) is bonded or brazed to the second insulator side. The semiconductor devices are bonded on their respective bottom sides to the second metal layer of the metal insulated substrate using an electrically conductive die attachment material such as solder. The second metal layer of the metal insulated substrate is typically patterned or etched to define a set of conductive contact areas (not shown) prior to attachment to the set of semiconductor devices. The insulator layer of the metal insulated substrate electrically insulates the first metal layer from the second metal layer.

The first metal layer of the metal insulated substrate is typically coupled or mounted to the baseplate. The baseplate is typically formed from a rigid metal or composite material having thermal conductive properties. The rigidity of the baseplate provides additional structural support for the POL module. In many cases, the baseplate is formed of copper and attached to the first metal layer of the metal insulated substrate using solder.

While conventional metal insulated substrates have good electrical insulation and good heat dissipating capabilities, the use of a conventional metal insulated substrate in a POL module has some drawbacks. The pre-fabricated three-layer construction of typical metal insulated substrates is relatively expensive compared to simpler structures. Also, the ability of the metal insulated substrate to thermally conduct heat from the semiconductor devices to the heat sink is limited by the thermal conductivity of the ceramic materials typically used to form the insulator layer of the metal insulated substrate. Accordingly, there are increasing demands for constructions that are smaller, lighter, and less costly, with improved thermal performance.

Referring to FIG. 1, a semiconductor device assembly or POL module 200 according to a non-limiting aspect is shown in cross-section. The POL module 200 includes a set of semiconductor devices 220, a dielectric sheet 240, a conductive layer 248, a first conductive plate 281, a first thermal interface layer 291, and a first heat sink 271.

The set of semiconductor devices 220 can comprise semiconductor devices 220 in the form of a die, diode, or other power electric device. While two semiconductor devices 220 are shown in FIG. 1, it will be appreciated that a greater or lesser number of semiconductor devices 220 can be included in the set of semiconductor devices 220. In addition to semiconductor devices 220, aspects of the POL module 200 can also include any number of additional circuitry components such as, for example, a gate driver (not shown).

Each semiconductor device 220 has a first side 221 (e.g., a bottom side) and an opposing second side 222 (e.g., a top side). The semiconductor devices 220 can comprise so-called "vertically-conducting" type semiconductor devices 220 which allow for electrical I/O interconnections to be made via first contact pads 231 arranged on the first side 221 as well as via second contact pads 232 arranged on the opposing second side 222. The first contact pads 231 and second contact pads 232 operatively couple the semiconductor device 220 to external circuitry (not shown) via the first conductive plate 281 and the conductive layer 248, respectively, and can be electrically coupled to internal elements within the semiconductor device 220. For example, a cable or bus bar (not shown) can be coupled to the conductive layer 248 using solder ball grid arrays (BGAs) or land grid arrays (LGAs) or mechanical connectors (not shown) and further coupled to an external circuit or device.

The dielectric sheet 240 has a first side 241 (e.g., a bottom side) and an opposing second side 242 (e.g., a top side). The set of semiconductor devices 220 are mounted on their respective second sides 222 to the first side 241 of the dielectric sheet 240. For example, in a non-limiting aspect, an adhesive (not shown) may be used to attach the set of semiconductor devices 220 to the first side of the dielectric sheet 241. The conductive layer 248 is arranged on the second side 242 of the dielectric sheet 240. In various aspects, the dielectric sheet 240 can comprise a lamination or a film. In non-limiting aspects, the dielectric sheet 240 can be formed of any of a variety of dielectric materials, such as polytetrafluoroethylene (PTFE), polysulfone materials, another polymer film, such as a liquid crystal polymer (LCP) or a polyimide material, or the like.

The dielectric sheet 240 defines a set of apertures 246 (e.g. vias) therethrough, extending between the first side 241 and second side 242. The set of apertures 246 can be formed through the dielectric sheet 240 to enable an electrical connection therethrough, that is, from the conductive layer 248 to the second contact pads 232 of the semiconductor devices 220. The conductive layer 248 can be coupled to the semiconductor devices 220 via the set of apertures 246. It will be appreciated that in aspects employing an optional adhesive to attach the set of semiconductor devices 220 to the dielectric sheet first side 241, the set of apertures 246 will likewise also extend through the adhesive. The set of apertures 246 can be arranged to have any desired size and spacing, extending through the dielectric sheet 240 or adhesive, or both, to enable an electrical connection from the conductive layer 248 to the second contact pads 232 of the semiconductor devices 220. In non-limiting aspects, the conductive layer 248 can comprise copper deposited (e.g., electroplated) onto the second side 242 of the dielectric sheet 240 and through the set of apertures 246 to enable an electrical connection therethrough, that is, from the conductive layer 248 to the second contact pads 232 of the semiconductor devices 220. The conductive layer 248 can have a low profile (e.g., less than 200 micrometers thick), planar interconnect structure that provides for formation of I/O connections (not shown) to and from the semiconductor devices 220.

In some aspects, a conductive post connector 244 can optionally be attached to the dielectric sheet 240 to provide an electrical connection from the conductive layer 248, through the apertures 246 to the first conductive plate 281. Additionally, spaces or gaps defined between the between the set of semiconductor devices 220 and post connector 244 can optionally be filled with a dielectric filler material 226. In various aspects, the dielectric filler material 226 can comprise a polymeric material, such as, for example, an underfill (e.g., capillary underfill or no-flow underfill), encapsulate, silicone, a molding compound, or the like.

The first conductive plate 281 includes a first conductive side 283 (e.g., a bottom side) and an opposing second conductive side 284 (e.g., a top side) defining a first thickness 285 therebetween. The first conductive plate 281 can be both electrically and thermally conductive across the first thickness 285. For example, in non-limiting aspects, the first conductive plate 281 can comprise a material having a high thermal and electrical conductivity, such as copper, aluminum, or a composite conductive material. In various non-limiting aspects, the first conductive plate 281 can comprise a monolithic or homogenous structure.

In an aspect, the set of semiconductor devices 220, are coupled or bonded, on their respective first sides 221 to the second conductive side 284 of the first conductive plate 281 layer using an electrically conductive die attachment material 257 such as solder. The second conductive side 284 of the first conductive plate 281 can be patterned or etched therethrough to define a set of conductive contact areas (not shown) prior to attachment or coupling to the set of semiconductor devices 220. In non-limiting aspects, the first conductive plate 281 can have a first thickness 285 of about 1 millimeter (mm). In other aspects, the first conductive plate 281 can have a first thickness 285 of about 5 mm. Other aspects are not so limited, and aspects of the first conductive plate 281 can have any desired first thickness 285 without departing from the scope of the disclosure herein.

The first heat sink 271 is thermally coupled to the POL module 200 to remove or dissipate heat generated by the set of semiconductor devices 220 during operation. In an aspect, the first heat sink 271 can comprise a material having a high thermal conductivity, such as copper, aluminum, or a composite material. The first heat sink 271 is thermally coupled to the first conductive plate 281 by way of the first thermal interface layer 291. For example, in an aspect the first thermal interface layer 291 can be disposed, or sandwiched between the first heat sink 271 and the first conductive plate 281. While the first heat sink 271 is depicted for ease of understanding and description, as a conventional passive finned heat sink, aspects are not so limited, and other heat sink arrangements may additionally or alternatively be arranged, including for example, active type heat sinks such as forced-air cooled heat sinks, liquid-cooled heat sinks, or various combinations thereof.

In various aspects, the first thermal interface layer 291 can be a thermally conductive, electrically insulating polymeric or organic material coating applied to the first conductive side 283 of the first conductive plate 281. The first thermal interface layer 291 is operative to electrically isolate the first heat sink 271 from the first conductive plate 281 and further operative to conduct heat generated by the set of semiconductor devices 220 from the first conductive plate 281 to the first heat sink 271. Additionally, as will be described in more detail herein, in some aspects, the material forming the first thermal interface layer 291 can have adhesive properties operative to bond the first heat sink 271 to the first conductive plate 281. In an aspect, the first thermal interface layer 291 can comprise thermally conductive ceramic fillers, particles, or fibers suspended in a polymer matrix (e.g., a resin or epoxy). For example, first thermal interface layer 291 can comprise an epoxy or silicon resin that is filled with thermally conductive, electrically insulating fillers such as alumina or boron nitride or a combination thereof. The first thermal interface layer 291 can be electrically insulating and thermally conductive, and can include a polymer matrix impregnated with about 6% to about 60%, by volume, thermally conductive ceramic materials that form continuous thermal pathways within the insulative coating.

In a non-limiting aspect, the first thermal interface layer 291 can be an insulative coating deposited along at least a portion of the first conductive side 283 of the first conductive plate 281. According to an aspect, the first thermal interface layer 291 can have a thickness of approximately 100 micrometers (μm). However, in other aspects, the first thermal interface layer 291 can have other thicknesses without departing from the scope of the disclosure herein.

While the POL module 200 depicted in FIG. 1 comprises a heat sink on one side (e.g., a bottom side) of the POL module 200, other aspects are not so limited. In other non-limiting aspects, the disclosed POL module can be arranged for double-sided cooling or electrical interconnection, such as including a first heat sink on both the bottom side of the POL module 200 and a second heat sink on the top side of the POL module 200.

Figure 2:
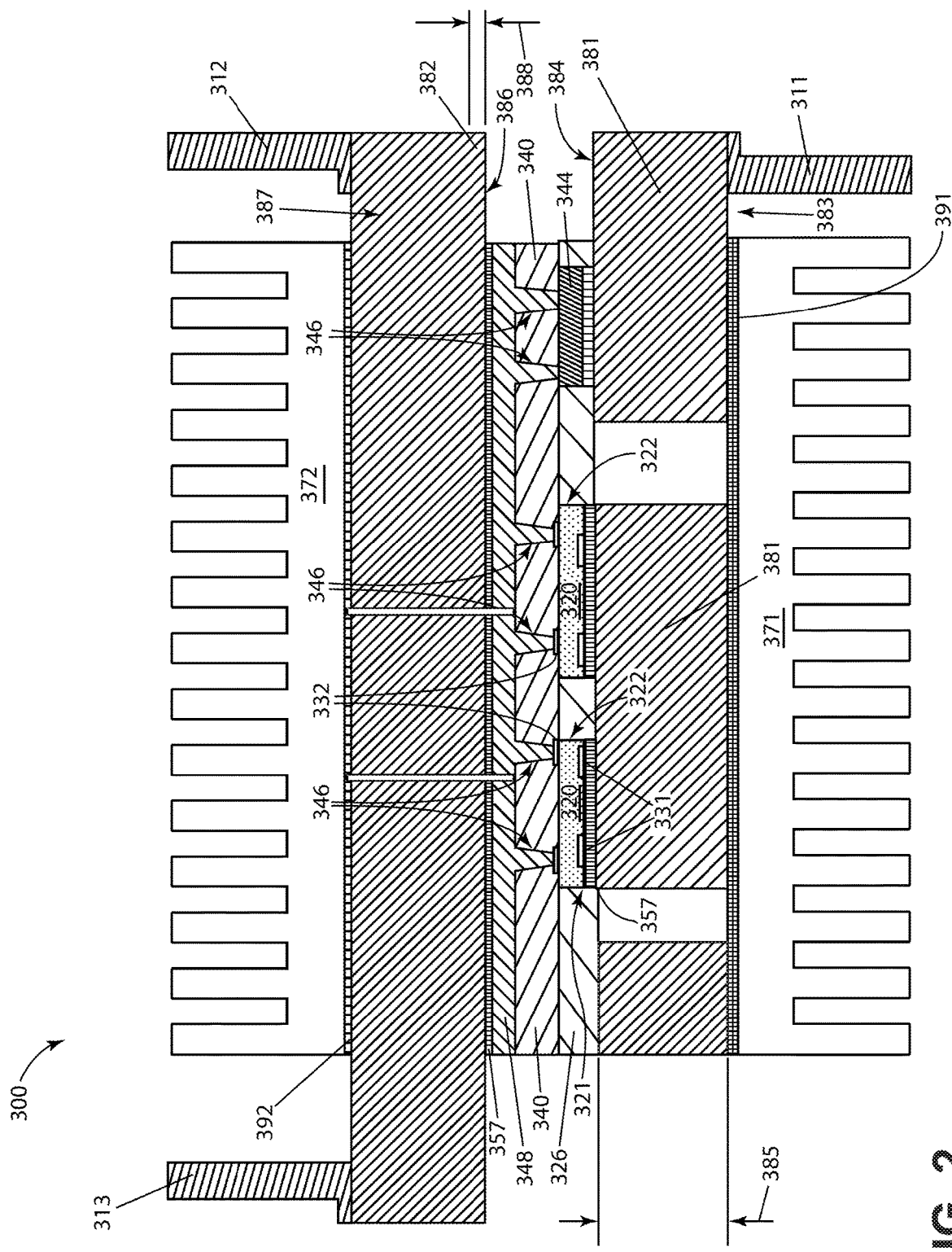
FIG. 2 illustrates a schematic cross-sectional view of another POL module, in accordance with various aspects described herein.

Referring to FIG. 2, a double-sided semiconductor device assembly or power overlay (POL) module according to another non-limiting aspect is shown. The schematic depiction illustrated in FIG. 2 is like the POL module 200 illustrated in FIG. 1, therefore, like parts will be identified with will be identified with the same reference number as FIG. 1, but increased by 100. One notable difference from the aspect depicted in FIG. 1 is that the POL module 300 depicted in FIG. 2 comprises a POL module 300 arranged for double-sided cooling and electrical interconnection.

The POL module 300 includes a set of semiconductor devices 320, a dielectric sheet 340, a conductive layer 348, a first conductive plate 381, a first thermal interface layer 391, and a first heat sink 371. Additionally, aspects of the POL module 300 can include a second conductive plate 382, a second thermal interface layer 392, and a second heat sink 372.

The set of semiconductor devices 320 in various aspects, can be in the form of a die, diode, or other power electric device. While two semiconductor devices 320 are shown in FIG. 2, it will be appreciated that a greater or lesser number of semiconductor devices 320 can be included in the set of semiconductor devices 320. Each semiconductor device 320 has a first side 321 (e.g., the bottom side) and an opposing second side 322 (e.g., the top side). The semiconductor devices 320 can comprise vertically-conducting type semiconductor devices 320 which allow for electrical I/O interconnections to be made via first contact pads 331 arranged on the first side 321 and via second contact pads 332 arranged on the opposing second side 322. The first contact pads 331 and second contact pads 332 operatively couple the semiconductor device 320 to external circuitry (not shown) via the first conductive plate 381 and the second conductive plate 382, respectively, and are electrically coupled to internal elements (not shown) within the semiconductor device 320. In addition to semiconductor devices 320, the POL module 300 can also include any number of additional circuitry components such as, for example, a gate driver (not shown).

The dielectric sheet 340 includes the first side 341 (e.g., the bottom side) and the opposing second side 342 (e.g., the top side). The set of semiconductor devices 320 are mounted on their respective second sides 322 to the first side 341 of the dielectric sheet 340, for example by way of an adhesive (not shown). The conductive layer 348 is arranged on the second side 342 of the dielectric sheet 340. In various aspects, the dielectric sheet 340 can comprise a lamination or a film. In non-limiting aspects, the dielectric sheet 340 can be formed of one a plurality of dielectric materials, such as polytetrafluoroethylene (PTFE), polysulfone materials or another polymer film, such as a liquid crystal polymer (LCP), a polyamide or polyimide material.

The dielectric sheet 340 defines a set of apertures 346 (e.g. vias) therethrough, extending between the first side 341 and second side 342. The set of apertures 346 can be formed through the dielectric sheet 340 to enable an electrical connection therethrough, that is, from the conductive layer 348 to the second contact pads 333 of the semiconductor devices 320. The conductive layer 348 can be coupled to the set of semiconductor devices 320 via the set of apertures 346. In non-limiting aspects, the conductive layer 348 can comprise copper deposited (e.g., electroplated) onto the second side 342 of the dielectric sheet 340 and through the set of apertures 346 to enable an electrical connection therethrough, that is, from the conductive layer 348 to the second contact pads 332 of the semiconductor devices 320. The conductive layer 348 can have a low profile (e.g., less than 200 micrometers thick), planar interconnect structure that provides for formation of I/O connections (not shown) to and from the semiconductor devices 320. For example, a cable or bus bar (not shown) can be coupled to the conductive layer 348 using solder ball grid arrays (BGAs) or land grid arrays (LGAs) or mechanical connectors (not shown) and further coupled to an external circuit or device.

In some aspects, a conductive post connector 344 can optionally be attached to the dielectric sheet 340 to provide a pass-through electrical connection from the conductive layer 348, through the apertures 346 to the first conductive plate 381. Additionally, spaces or gaps defined between the between the set of semiconductor devices 320 and post connector 344 can optionally be filled with a dielectric filler material 326. In various aspects, the dielectric filler material 326 can comprise a polymeric material, such as, for example, an underfill (e.g., capillary underfill or no-flow underfill), encapsulate, silicone, or a molding compound.

The first conductive plate 381 includes the first side 383 (e.g., the bottom side) and the opposing second conductive side 384 (e.g., the top side) defining a first thickness 385 therebetween. The first conductive plate 381 can be both electrically and thermally conductive across the first thickness 385. For example, in non-limiting aspects, the first conductive plate 381 can comprise a material having a high thermal and electrical conductivity, such as copper, aluminum, or a composite conductive material. In an aspect, the first conductive plate 381 can comprise a single copper sheet. In various aspects, the first conductive plate 381 can comprise a monolithic or homogenous structure.

In an aspect, the set of semiconductor devices 320, are coupled or bonded, on their respective first sides 321 to the second conductive side 384 of the first conductive plate 381 layer using an electrically conductive die attachment material 357 such as solder. The second conductive side 384 of the first conductive plate 381 can be patterned or etched to define a set of conductive contact areas (not shown) prior to attachment to the set of semiconductor devices 320. In non-limiting aspects, the first conductive plate 381 can have a first thickness 385 of about 1 millimeter (mm). In other aspects, the first conductive plate 381 can have a first thickness 385 of about 5 mm. Other aspects are not so limited, and aspects of the first conductive plate 381 can have any desired first thickness 385 without departing from the scope of the disclosure herein.

The first heat sink 371 is thermally coupled to the POL module 300 to remove or dissipate heat generated by the set of semiconductor devices 320 during operation. While the first heat sink 271 is depicted for ease of understanding and description, as a conventional passive finned heat sink, aspects are not so limited, and other heat sink arrangements may additionally or alternatively be arranged, including for example, active type heat sinks such as forced-air cooled heat sinks, liquid-cooled heat sinks, or various combinations thereof.

In an aspect, the first heat sink 371 can comprise a material having a high thermal conductivity, such as copper, aluminum, or a composite material. The first heat sink 371 is thermally coupled or bonded to the first conductive plate 381 by way of the first thermal interface layer 391. For example, in an aspect, the first thermal interface layer 391 can be disposed or sandwiched between the first heat sink 371 and the first conductive plate 381.

The first thermal interface layer 391 is operative to electrically isolate the first heat sink 371 from the first conductive plate 381 and further operative to conduct heat generated by the set of semiconductor devices 320 from the first conductive plate 381 to the first heat sink 371.

In various aspects, the first thermal interface layer 391 can be a thermally conductive, electrically insulating polymeric or organic material coating applied to the first side 383 of the first conductive plate 381. In other aspects, the first thermal interface layer 391 can be applied as a coating to the first heat sink 371. In still other aspects, the first thermal interface layer 391 can be applied as a coating to both the first side 383 of the first conductive plate 381 and the first heat sink 371. Additionally, as will be described in more detail herein, in some aspects, the material forming the first thermal interface layer 391 can have adhesive properties operative to bond the first heat sink 371 to the first conductive plate 381. In an aspect, the first thermal interface layer 391 can comprise thermally conductive ceramic fillers, particles, or fibers suspended in a polymer matrix (e.g., a resin or epoxy). For example, first thermal interface layer 391 can comprise an epoxy or silicon resin that is filled with thermally conductive, electrically insulating fillers such as alumina or boron nitride or a combination thereof. The first thermal interface layer 391 can be electrically insulating and thermally conductive, and can include a polymer matrix impregnated with about 6% to about 60%, by volume, thermally conductive ceramic materials that form continuous thermal pathways within the insulative coating.

In a non-limiting aspect, the first thermal interface layer 391 can be an insulative coating deposited along at least a portion of the first side 383 of the first conductive plate 381. According to an aspect, the first thermal interface layer 391 can have a thickness of approximately 100 micrometers (μm). However, in other aspects, the first thermal interface layer 391 can have other thicknesses without departing from the scope of the disclosure herein.

A second conductive plate 382 includes a first side 386 (e.g., a bottom side) and an opposing second side 387 (e.g., a top side) defining a second thickness 388 therebetween. The second conductive plate 382 can be both electrically and thermally conductive across the second thickness 388. For example, in non-limiting aspects, the second conductive plate 382 can comprise a material having a high thermal and electrical conductivity, such as copper, aluminum, or a composite conductive material. In an aspect, the second conductive plate 382 can comprise a single copper sheet. In various aspects the second conductive plate 382 can comprise a monolithic or homogenous structure. In some aspects, the structure of the second conductive plate 382 can be identical to the first conductive plate 381.

In non-limiting aspects, the second conductive plate 382 can have an overall thickness of approximately 1 millimeter (mm). In an aspect, the conductive layer 348 is typically coupled or bonded, to the first side 386 of the second conductive plate 382 using an electrically conductive die attachment material 357 such as solder. In other aspects, the second conductive plate 382 can have a second thickness 388 of about 5 mm. Other aspects are not so limited, and aspects of the second conductive plate 382 can have any desired second thickness 388 without departing from the scope of the disclosure herein.

The second heat sink 372 is thermally coupled to the POL module 300 to remove or dissipate heat generated by the set of semiconductor devices 320 during operation. While the second heat sink 372 is depicted for ease of understanding and description, as a conventional passive finned heat sink, aspects are not so limited, and other heat sink arrangements may additionally or alternatively be arranged, including for example, active type heat sinks such as forced-air cooled heat sinks, liquid-cooled heat sinks, or various combinations thereof.

In an aspect, the second heat sink 372 can comprise a material having a high thermal conductivity, such as copper, aluminum, or a composite material. The second heat sink 372 is thermally coupled to the second conductive plate 382 by way of the second thermal interface layer 392. For example, in an aspect, the second thermal interface layer 392 can be disposed or sandwiched between the second heat sink 372 and the second conductive plate 382.

The second thermal interface layer 392 is operative to electrically isolate the second heat sink 372 from the second conductive plate 382 and further operative to conduct heat generated by the set of semiconductor devices 320 from the second conductive plate 382 to the second heat sink 372.

In various aspects, the second thermal interface layer 392 can be a thermally conductive, electrically insulating polymeric or organic material coating applied to the second side 387 of the second conductive plate 382. In other aspects, the second thermal interface layer 392 can be applied as a coating to the second heat sink 372. In still other aspects, the second thermal interface layer 392 can be applied as a coating to both the second side 387 of the second conductive plate 382 and the heat sink. Additionally, as will be described in more detail herein, in some aspects, the material forming the second thermal interface layer 392 can have adhesive properties operative to bond the second heat sink 372 to the second conductive plate 382. In an aspect, the second thermal interface layer 392 can comprise thermally conductive ceramic fillers, particles, or fibers suspended in a polymer matrix (e.g., a resin or epoxy). For example, the second thermal interface layer 392 can comprise an epoxy or silicon resin that is filled with thermally conductive, electrically insulating fillers such as alumina or boron nitride or a combination thereof. The second thermal interface layer 392 can be electrically insulating and thermally conductive, and can include a polymer matrix impregnated with about 6% to about 60%, by volume, thermally conductive ceramic materials that form continuous thermal pathways within the insulative coating.

In a non-limiting aspect, the second thermal interface layer 392 can be an insulative coating deposited along at least a portion of the second side 387 of the second conductive plate 382, or a portion of the second heat sink 372, or both. According to an aspect, the second thermal interface layer 392 can have a thickness of approximately 100 micrometers (μm). However, in other aspects, the second thermal interface layer 392 can have other thicknesses without departing from the scope of the disclosure herein. Furthermore, in various aspects, a set of power transmission lines 311, 312, 313 (e.g., a set of bus bars) can optionally be electrically coupled to a respective one of the first and second plate 381, 382, (e.g., to provide input power to the POL module 300, or receive electrical signals therefrom, or both). In some non-limiting aspects, the set of power transmission lines 311, 312, 313 may be coupled to the first and second plate 381, 382, respectively, using mechanical fasteners.

Figure 3:
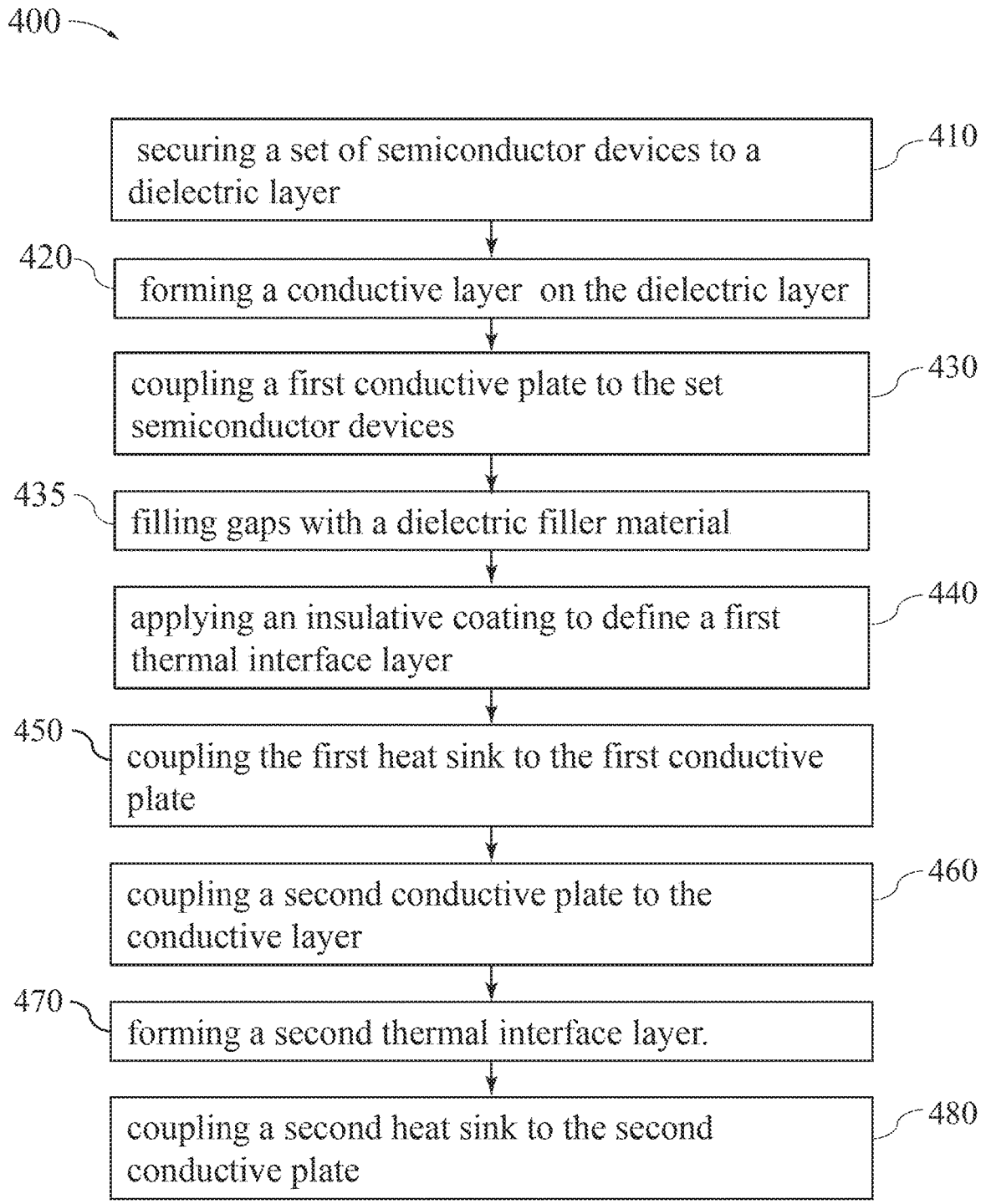
FIG. 3 is a flow diagram illustrating a method of assembling a POL module, in accordance with various aspects described herein.

FIG. 3 is a method flow diagram illustrating a non-limiting aspect of a method 400 for fabricating the POL module 200, 300 according to a non-limiting aspect is shown. The POL module 200, 300 can include a set of semiconductor devices 320, 220 having first and second sides 321, 322, 221, 222 a dielectric sheet 340, 240 having first and second sides 341, 342, 241, 242 a conductive layer 348, 248 a first conductive plate 381, 281 a first thermal interface layer 391, 291 and a first heat sink 371, 271 according to an aspect. It will be appreciated that in some aspects, the dielectric sheet 340, 240 can comprise apertures 346, 246 defined therethrough. In other aspects the formation of the apertures 346, 246 can be accomplished using conventional techniques prior to, or in conjunction with, the method 400.

The method 400 begins by coupling a set of semiconductor devices to a dielectric layer, at 410. For example, in non-limiting aspects, the coupling can comprise applying an adhesive onto dielectric sheet 340, 240 and mounting the set of semiconductor devices 320, 220 on their respective second sides 332, 232 to the first side 341, 241 of the dielectric sheet 340, 240 and curing the adhesive.

The method 400 includes, at 420, forming a conductive layer 348, 248 on the second side 342, 242 of the dielectric sheet 340, 240. In non-limiting aspects, the forming of the conductive layer 348, 248 can comprise any desired conventional metallization technique such as sputtering and electroplating. In other non-limiting aspects, other conventional metal deposition techniques can be used to form the conductive layer 348, 248. The conductive layer 348, 248 can also be etched or patterned to define metal interconnects or vertical feed-throughs through the dielectric sheet 340, 240 and the adhesive 337, 237. It will be appreciated that in some aspects, the forming the conductive layer can include metallizing the apertures 346, 246 defined through the dielectric sheet 340, 240. In other aspects the metallization of the apertures 346, 246 can be accomplished using conventional techniques prior to, or in conjunction with, method 400

The method 400 includes, at 430, coupling a first conductive plate 381, 281 to the respective first sides 321, 221 of the semiconductor devices 320, 220. In an aspect, the first conductive plate 381, 281 can be soldered to the respective first sides 321, 221 of semiconductor devices 320, 220. Optionally, at 435, additional electrical insulation and structural integrity to the POL module 200, 300 by filling with a dielectric filler material 326, 226 any gaps between and around the set of semiconductor devices 320, 220.

The method 400 includes, at 440, forming a first thermal interface layer 391, 291. The forming of the first thermal interface layer 391 can comprise applying an insulative coating to the first side 383, 283 of the first conductive plate 381, 281 to define the first thermal interface layer 391, 291. In other aspects, the insulative coating can be applied to the first heat sink 371, 271 to form of the first thermal interface layer 391, 291. In still other aspects, the insulative coating can be applied to both the first conductive side 383, 283 of the first conductive plate 381281, and the first heat sink 371, 271 to define the first thermal interface layer 391, 291. In an aspect, the material used to form the first thermal interface layer 391, 291 can comprise ceramic materials in a polymer resin that is applied by powder coating or other application techniques, such as brushing, or rolling techniques. In other aspects, the material can comprise pure ceramic coatings in a polymer matrix having high thermal conductivity and good dielectric strength and can be applied by chemical vapor deposition ("CVD"), thermal spray, or by electrophoretic deposition ("EPD"). As will be understood, CVD is a conventional deposition process in which a substrate is exposed to one or more volatile precursors, which react or decompose on the substrate surface to produce the desired deposit, and can be done at atmospheric pressure, low pressure, or in a vacuum. As will also be understood, EPD is a conventional electrochemical coating process, in which charged dispersed particles suspended in a liquid medium migrate under the influence of an applied electric field (i.e., electrophoresis), and are deposited onto an electrode (e.g., the first conductive plate 381, 281, the first heat sink 371, 271, or both).

In some non-limiting aspects, the first thermal interface layer 391 can be formed using a first material and a second material sequentially applied to at least one of the first conductive side 383, 283 of the first conductive plate 381, 281, and the first heat sink 371, 271. The two sequentially deposited materials can then be cured at an elevated temperature to infuse the second material into the second material to form a monolithic insulative coating that is both thermally conductive and electrically insulating to define the first thermal interface layer 391, 291.

For example, a desired thermal conductivity of the first thermal interface layer 391, 291 can be achieved by incorporating a predetermined amount of thermally conductive ceramic materials, such as aluminum nitride (AlN), boron nitride (BN), aluminum oxide (Al2O3), or a combination thereof in the first material. The thermally conductive ceramic materials can be uniformly distributed or densely packed to form highly connected thermal conducting paths above a percolation threshold. Additionally, the second material, can be a thermoset polymer resin or an epoxy comprising at least one of liquid crystal polymers, thermal plastics, organic monomers, and oligomers, or a combination thereof arranged in a matrix. In an aspect the second material can be subsequently deposited over the first material. In other non-limiting aspects, the second material can comprise silicon. In still other non-limiting aspects the second material can comprise a thermoset polymer, such as a polyamide-imide. After the first material and the second material are applied, the first conductive plate 381, 281 can be heat treated or cured at an elevated temperature to infuse the second material into the first material and define first thermal interface layer 391, 291.

The method 400 also includes, at 450 coupling the first heat sink 371, 271 to the first conductive side 383, 283 of the first conductive plate 381, 281, with the second thermal interface layer 392, 292 disposed therebetween. In some aspects, the first heat sink 371, 271 can be mechanically coupled to the first conductive plate 381, 281 for example by using non-conductive or insulated fasteners or clamps. In other aspects, the first heat sink 371, 271 can be adhesively coupled to the first conductive plate 381, 281. Regardless of the coupling method used, the first thermal interface layer 391, 291 is disposed between the first conductive plate 381, 281 and the first heat sink 371, 271. For example, in some aspects the material selected to form the first thermal interface layer 391, 291 can exhibit adhesive properties prior to curing. In such non-limiting aspects, after the selected material is applied and is still in a tacky state, the first heat sink 371, 271 can be positioned and clamped to the first conductive plate 381, 281 prior to heat treating or curing. In some aspects, the coupling the first heat sink 371, 271 to the first conductive side 383, 283 of the first conductive plate 381, 281, at 450, can additionally include curing the first thermal interface layer 391, 291 at an elevated temperature, thereby bonding or adhesively coupling the first heat sink 371, 271 to the first conductive plate 381, 281 with the first thermal interface layer 391, 291 therebetween, without further need of fasteners or clamps.

In other aspects, the method can include at 460, coupling a second conductive plate 382 to the conductive layer 348. In an aspect, the second conductive plate 382 can be soldered to the conductive layer 348.

The method 400 includes, at 470, forming a second thermal interface layer 392. The forming of the second thermal interface layer 392 can comprise applying an insulative coating to the second side 387 of the second conductive plate 382 to define the second thermal interface layer 392. In other aspects the insulative coating can be applied to the second heat sink 372. In still other aspects, the insulative coating can be applied to both the second side 387 of the second conductive plate 382 and the second heat sink 372 to define the second thermal interface layer 392. In an aspect, the material used to form the second thermal interface layer 392 can comprise the same materials and application techniques as disclosed hereinabove with respect to the first thermal interface layer 391.

For example, in some non-limiting aspects, the second thermal interface layer 392 can be deposited using a first material and a second material sequentially applied to at least one of the second side 387 of the second conductive plate 382, and the second heat sink 372. The two sequentially deposited materials can then be cured at an elevated temperature to infuse the second material into the first material to form a monolithic insulative coating that is both thermally conductive and electrically insulating to define the second thermal interface layer 392.

The method 400 can also include, at 480, coupling the second heat sink 272 to the second conductive plate 382 with the second thermal interface layer 392 disposed therebetween. In some aspects, the second heat sink 372 can be mechanically coupled to the second conductive plate 382, for example by using non-conductive or insulated fasteners or clamps (not shown). In some aspects, the coupling the second heat sink 372 to the second conductive plate 382, at 480, can additionally include curing the second thermal interface layer 392 at an elevated temperature. In other aspects, the second heat sink 372 can be adhesively coupled to the second conductive plate 382. Regardless of the coupling method used, the second thermal interface layer 392 is disposed between the second conductive plate 382 and the second heat sink 372.

For example, in some aspects the material selected to form the second thermal interface layer 392 can exhibit adhesive properties prior to curing. In such non-limiting aspects, after the selected material is applied and is still in a tacky state, the second heat sink 372 can be positioned and clamped to the second conductive plate 382 prior to heat treating or curing. The second thermal interface layer 392 can then be cured at an elevated temperature, thereby bonding or adhesively coupling the second heat sink 372 to the second conductive plate 382 with the second thermal interface layer 392 therebetween, without further need of fasteners or clamps.

To the extent not already described, the different features and structures of the various aspects can be used in combination with each other as desired. That one feature is not illustrated in all the aspects is not meant to be construed that it is not included, but is done for brevity of description. Thus, the various features of the different aspects can be mixed and matched as desired to form new aspects of the disclosure, whether the new aspects are expressly described. All combinations or permutations of features described herein are covered by this disclosure.

This written description uses examples to disclose aspects of the disclosure, including the best mode, and to enable any person skilled in the art to practice the aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Various characteristics, aspects and advantages of the present disclosure can also be embodied in any permutation of aspects of the disclosure, including but not limited to the following technical solutions as defined in the enumerated aspects:

A power overlay (POL) module comprising: a semiconductor device having a first side and an opposing second side; a dielectric sheet having a first side coupled to the semiconductor device second side, and an opposing second side, the dielectric sheet defining an aperture therethrough; a first conductive layer disposed on the second side of the dielectric sheet and electrically coupled through the aperture to the semiconductor device second surface; a first conductive plate having a first side, and an opposing second side coupled to the first surface of the semiconductor device; a first heat sink coupled the first side of the conductive plate; and a first thermal interface layer disposed between the first conductive plate and the first heat sink.

The POL module of the preceding clause, wherein the first thermal interface layer is an electrically insulating, thermally conductive first coating deposited on the first conductive plate.

The POL module of any of the preceding clauses, wherein the first thermal interface layer is an electrically insulating, thermally conductive first coating deposited on the first heat sink.

The POL module of any of the preceding clauses, wherein the first coating comprises a thermally conductive ceramic material.

The POL module of any of the preceding clauses, wherein the first coating further comprises at least one of liquid crystal polymers, thermal plastics, organic monomers, and oligomers.

The POL module of any of the preceding clauses, further comprising a second conductive plate having a first side coupled to the conductive layer, and an opposing second side.

The POL module of any of the preceding clauses, further comprising a second heat sink coupled to the second side of the second conductive plate.

The POL module of any of the preceding clauses, further comprising a second thermal interface layer disposed between the second conductive plate and the second heat sink.

The POL module of any of the preceding clauses, wherein the second thermal interface layer is an electrically insulating, thermally conductive second coating deposited on the second conductive plate.

The POL module of any of the preceding clauses, wherein the second thermal interface layer is an electrically insulating, thermally conductive second coating deposited on the second heat sink.

The POL module of any of the preceding clauses, wherein the second thermal interface layer comprises a thermally conductive ceramic material.

The POL module of any of the preceding clauses, wherein the second thermal interface layer further comprises at least one of liquid crystal polymers, thermal plastics, organic monomers, and oligomers.

A method of assembling a POL module comprising: coupling a set of semiconductor devices to a dielectric sheet; forming a conductive layer on the dielectric sheet; coupling a first conductive plate to the set of semiconductor devices; applying an electrically insulative, thermally conductive first coating to at least one of the first conductive plate and a first heat sink, the first coating defining a first thermal interface layer; and coupling the first heat sink to the first conductive plate with the first thermal interface layer disposed therebetween.

The method of the preceding clause, wherein the first thermal interface layer comprises a thermally conductive ceramic material.

The method of any of the preceding clauses, wherein the first thermal interface layer further comprises at least one of liquid crystal polymers, thermal plastics, organic monomers, and oligomers.

The method of any of the preceding clauses, further comprising filling a gap defined between semiconductor devices of the set of semiconductor devices with a dielectric filler material.

The method of any of the preceding clauses, further comprising coupling a second conductive baseplate to the conductive layer.

The method of any of the preceding clauses, further comprising applying an electrically insulating, thermally conductive second coating to at least one of the second conductive plate and a second heat sink, the second coating defining a second thermal interface layer; and coupling the second heat sink to the second conductive plate with the second thermal interface layer therebetween.

The method of any of the preceding clauses, wherein the second thermal interface layer comprises a thermally conductive ceramic material.

The method of any of the preceding clauses, wherein the second thermal interface layer further comprises at least one of liquid crystal polymers, thermal plastics, organic monomers, and oligomers.

What is claimed is:

1. A power overlay (POL) module comprising:
    a semiconductor device having a first side and an opposing second side;
    a dielectric sheet having a first side coupled to the semiconductor device second side, and an opposing second side, the dielectric sheet defining an aperture therethrough;
    a conductive layer disposed on the second side of the dielectric sheet and electrically coupled through the aperture to the semiconductor device second side;
    a first electrically conductive plate having a first side, and an opposing second side coupled to the first side of the semiconductor device;
    a second conductive plate having a first side coupled to the conductive layer, and an opposing second side;
    a first heat sink thermally coupled to the first side of the first electrically conductive plate;
    a second heat sink coupled to the second side of the second conductive plate;
    a first thermal interface layer directly coupled to the first side of the first electrically conductive plate and disposed between the first electrically conductive plate and the first heat sink; and
    a second thermal interface layer disposed between the second conductive plate and the second heat sink.

2. The POL module of claim 1, wherein the first thermal interface layer is an electrically insulating, thermally conductive first coating deposited on the first electrically conductive plate.

3. The POL module of claim 2 wherein the first coating comprises a thermally conductive ceramic material.

4. The POL module of claim 3 wherein the first coating further comprises at least one of liquid crystal polymers, thermal plastics, organic monomers, and oligomers.

5. The POL module of claim 1, wherein the first thermal interface layer is an electrically insulating, thermally conductive first coating deposited on the first heat sink.

6. The POL module of claim 1 wherein the second thermal interface layer is an electrically insulating, thermally conductive second coating deposited on the second conductive plate.

7. The POL module of claim 1, wherein the second thermal interface layer is an electrically insulating, thermally conductive second coating deposited on the second heat sink.

8. The POL module of claim 1, wherein the second thermal interface layer comprises a thermally conductive ceramic material.

9. The POL module of claim 1, wherein the second thermal interface layer further comprises at least one of liquid crystal polymers, thermal plastics, organic monomers, and oligomers.

10. A method of assembling a POL module comprising:
    coupling a set of semiconductor devices to a dielectric sheet;
    forming a conductive layer on the dielectric sheet;
    electrically coupling a first electrically conductive plate to the set of semiconductor devices;
    coupling a second conductive plate to the conductive layer;
    applying an electrically insulative, thermally conductive first coating to at least one of the first electrically conductive plate and a first heat sink, the first coating defining a first thermal interface layer;
    applying an electrically insulating, thermally conductive second coating to at least one of the second conductive plate and a second heat sink, the second coating defining a second thermal interface layer;
    coupling the first heat sink to the first electrically conductive plate with the first thermal interface layer disposed therebetween and directly coupled to a first side of the first electrically conductive plate; and
    coupling the second heat sink to the second conductive plate with the second thermal interface layer therebetween.

11. The method of claim 10, wherein the first thermal interface layer comprises a thermally conductive ceramic material.

12. The method of claim 11, wherein the first thermal interface layer further comprises at least one of liquid crystal polymers, thermal plastics, organic monomers, and oligomers.

13. The method of claim 10, further comprising filling a gap defined between semiconductor devices of the set of semiconductor devices with a dielectric filler material.

14. The method of claim 10, wherein the second thermal interface layer comprises a thermally conductive ceramic material.

15. The method of claim 10, wherein the second thermal interface layer further comprises at least one of liquid crystal polymers, thermal plastics, organic monomers, and oligomers.

\* \* \* \* \*